United States Patent [19]

Ames

[11] Patent Number: 5,654,631
[45] Date of Patent: Aug. 5, 1997

[54] VACUUM LOCK HANDLER AND TESTER INTERFACE FOR SEMICONDUCTOR DEVICES

[75] Inventor: Kenneth D. Ames, San Jose, Calif.

[73] Assignee: Xilinx, Inc., San Jose, Calif.

[21] Appl. No.: 559,265

[22] Filed: Nov. 15, 1995

[51] Int. Cl.$^6$ ................................................ G01R 31/02
[52] U.S. Cl. ........................................ 324/158.1; 324/758
[58] Field of Search ............................ 324/158.1, 73.1, 324/754, 755, 756, 725, 758; 439/482; 269/134, 20, 21; 414/673, 590, 224, 216; 198/573

[56] References Cited

U.S. PATENT DOCUMENTS

| | | | |
|---|---|---|---|
| 4,164,704 | 8/1979 | Kato et al. | 324/73 |
| 4,352,061 | 9/1982 | Matrone | 324/158 |
| 4,357,062 | 11/1982 | Everett | 339/18 R |
| 4,527,942 | 7/1985 | Smith | 414/590 |
| 4,588,346 | 5/1986 | Smith | 414/673 |
| 4,589,815 | 5/1986 | Smith | 414/590 |
| 4,626,776 | 12/1986 | Wilkinson | 324/754 |
| 4,715,574 | 12/1987 | Holt et al. | 248/297.1 |
| 4,771,234 | 9/1988 | Cook et al. | 324/158 F |
| 5,150,042 | 9/1992 | Look et al. | 324/158 R |
| 5,214,374 | 5/1993 | St. Onge | 434/482 |
| 5,550,480 | 8/1996 | Nelson et al. | 324/756 |

OTHER PUBLICATIONS inTEST, "The inTEST Handbook, A Guide to Test Head Positioning and Interfacing," Revision 4.0, available from inTEST Corporation, Western U.S. Office, Suite A, 1030 E. Duane Ave., Sunnyvale, CA 94086, Copyright 1992. (No Month Available).

*Primary Examiner*—Vinh P. Nguyen
*Attorney, Agent, or Firm*—Edel M. Young; Thomas S. MacDonald, Esq.

[57] ABSTRACT

A semiconductor device test head docking interface system includes a test head plate juxtaposed to a test head. The tester plate includes pairs of outwardly facing spaced vacuum cups and pairs of spaced guiding and locking pins between the cups. A handler plate includes pairs of vacuum cup receiving surfaces spaced to receive the vacuum cups upon a docking of the plates, and pairs of receiving sockets spaced to receive the guiding and locking pins upon a docking of the plates. Rotary actuators are mounted on the tester plate for rotating each of the guiding and locking pins in a respective one of the receiving sockets, such that engagement and a pulling vacuum in the vacuum cups against the vacuum cup receiving surfaces and rotation of the guiding and locking pins, effects docking of the tester plate and handler plate. A Z-axis adjustment is provided in each actuator.

11 Claims, 8 Drawing Sheets

VACUUM LOCK HANDLER AND TESTER INTERFACE FOR SEMICONDUCTOR DEVICES

RELATED APPLICATION

This application relates to U.S. patent application Ser. No. 08/123,415 filed Sep. 17, 1993 and commonly assigned to Applicant's assignee. This subject matter of the application is incorporated herein by reference.

FIELD OF THE INVENTION

This invention is directed to a vacuum lock handler and tester interface useful in the testing of semiconductor devices. More particularly the invention relates to a vacuum lock which interlocks a semiconductor device handler and a tester in a docking operation.

BACKGROUND OF THE INVENTION

Testing systems for integrated circuits contained on a motherboard include a docking assembly for aligning a test head to a semiconductor performance board device handler. As seen in U.S. Pat. No. 4,352,061 vacuum fixtures have been heretofore employed for connecting test points on a circuit board to test probes within a platen. The board to be tested is pulled down by vacuum to make electrical contact with probes which have been moved to a test position dictated by the pattern of test points on the board to be tested. In U.S. Pat. No. 5,150,042 an automatic semiconductor wafer test probe apparatus is disclosed wherein a wafer is vacuum held on a magnet on an X-Y-Z chuck. The chuck is moved to bring the wafer test sites into contact with a set of test probes. U.S. Pat. No. 4,771,234 shows a vacuum activated test fixture for boards where a board is sealed on a vacuum chamber and moved by suction into securement and electrical contact with electronic components under test. U.S. Pat. No. 4,527,942 discloses an electronic test head positioned particularly for testing semiconductor wafers which utilizes a clamping system with location pins inserted into openings in a handler plate while a test connector mates with the device being tested.

The related application discloses a test head interface including a plate, vacuum cups and guiding pins which mate with apertures in a stacking block. While in some usages the interface, which includes four vacuum cups, is operational, problems have arisen. These problems included poor vacuum holding, bending of the plates holding the vacuum cups, buckling of the vacuum cups, attendant release of vacuum, and the need for additional clamping between the plate and the test head. Hook and bail (fishing tackle box-type) clamps were added as an expedient to improve performance. Stiffer i.e., thicker, plates have been used in other attempts to solve these problems.

SUMMARY OF THE INVENTION

The present invention solves the above interconnect problems by providing spaced pairs of spaced vacuum cups typically adjacent to the edges of a test head plate and pairs of equally spaced guiding and locking bayonet-style pins therebetween which together function to "pull" the test head (once in alignment) to the handler. A handler (receiver) plate of the same operational configuration as the test head plate is incorporated on a horizontal or vertical or skewed surface of the handler. The handler plate may include an aperture for mounting devices under test adjacent to the test head. Each handler plate includes pairs of spaced typically flat surfaces at each side for vacuum cup reception (upon docking of the tester and handler and the respective test head plate and handler plate). The handler plate also includes spaced pairs of guiding and locking receiving sockets aligned, upon docking, with the guiding and locking pins on the test head plate. Docking and locking is performed by bringing the vacuum suction cups into engagement with the surfaces of the handler plate(s) with the guide pins in rough alignment; pulling a vacuum in the interior of the cups so that the cups collapse and hold against the end surfaces of the handler plate; and allowing the locking pins on the test head plate to enter into the receiving sockets. The sockets include a cylindrical locking sleeve having a pair of opposed inwardly-facing fixed locking pins. The guide and locking pins on the tester plate include a longitudinal-slotted peripheral edge portion. The slots have a width slightly greater than the diameter of the fixed locking pins such that the test head plate guide and locking pins can pass the handler locking pins as the test plate guide and locking pins are inserted into the receiving sockets. After the test plate guide and locking pin slots clear the handler locking pins, a rotary actuator is actuated to rotate the test plate guide pins approximately 90° so that the guide pins are held within the receiving sockets in a bayonet-type locking action. This action pre-loads the handler and test head plates with about 45–50 pounds of full-pressure at the interface between each of the four vacuum cups and the corresponding surface on the handler plate. Thus a total pull of from about 180 pounds to 200 pounds is provided at the interface. In one embodiment a rotary actuator screw thread adjustment is provided to afford a fine adjustment, e.g. 0.68 mm, in Z-axis movement of the handler and test head. Coarse adjustment is made by the matching geometry of the test head plate and the handler plate. This prevents any stress damage to the board or pins or to the electronic elements or devices on the board under test.

In another embodiment a dual or triple station docking plate may be utilized by moving an adjustable position receiver on the handler plate to a detented position as specified by application in either direction e.g. in x-y axis, then turning a knurled thumb screw into a detent.

DETAILED DESCRIPTION

Figure 1A:
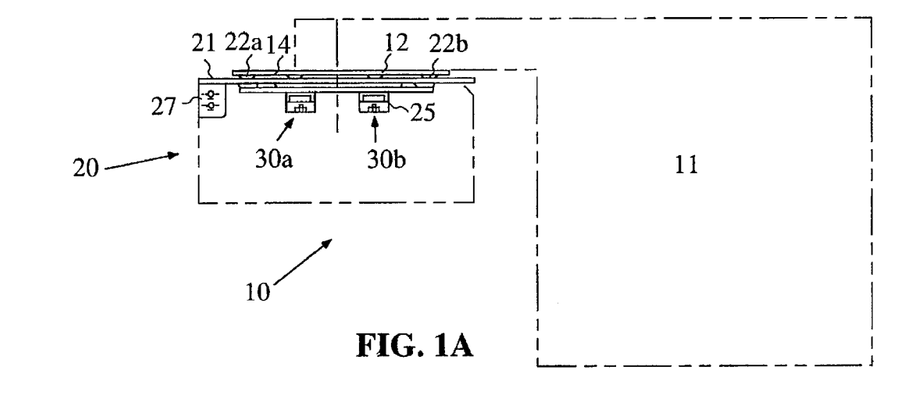
FIG. 1A is a schematic side view of the handler/tester interface between a test head and handler.
Figure 1B:
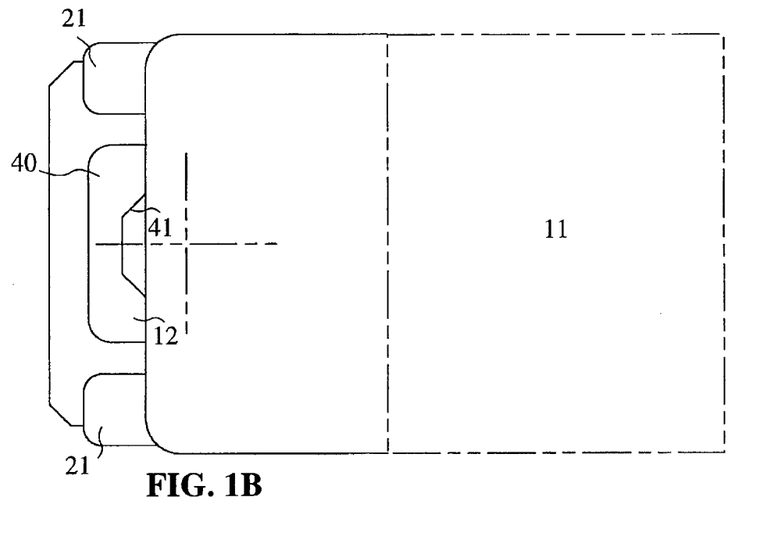
FIG. 1B is a top view thereof.
Figure 1C:
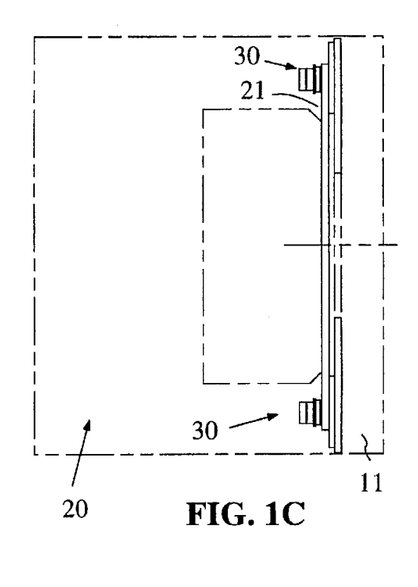
FIG. 1C is an end view thereof.
Figure 5:
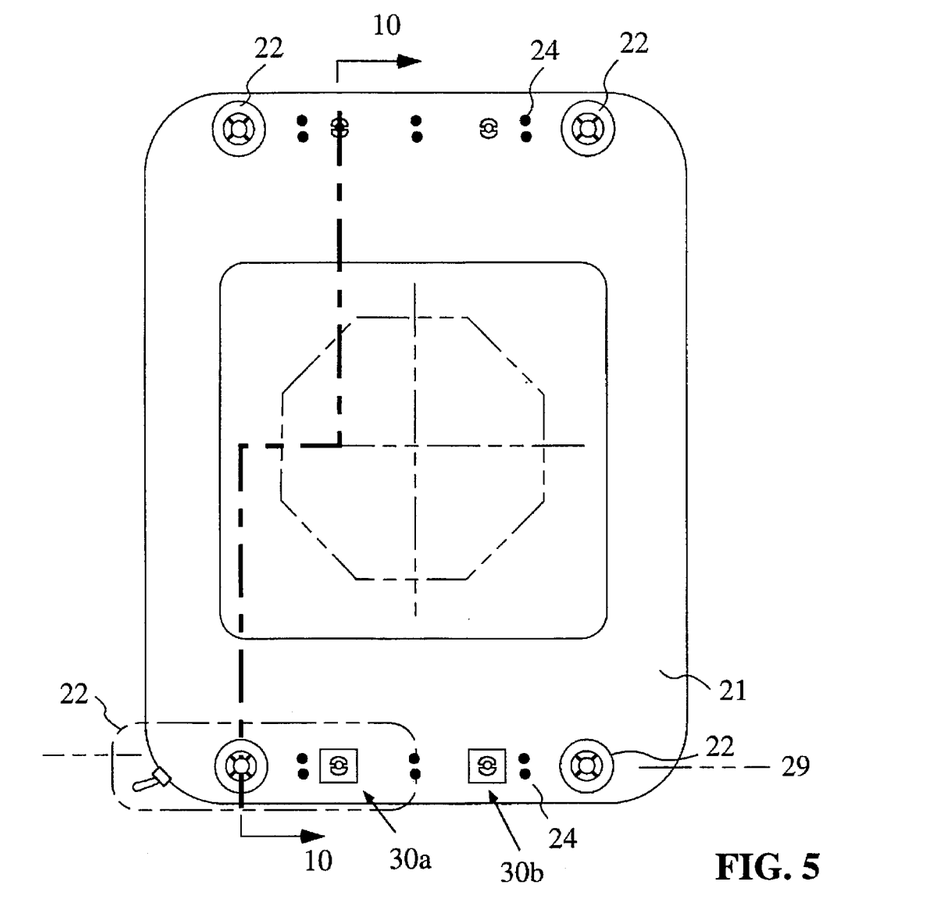
FIG. 5 is a schematic top view of a test head plate.

FIGS. 1A, 1B and 1C represent a semiconductor device test head and device handler interface 10 in which a test head holder 20 interfaces with a handler 11 having a handler docking plate or structure 12. The test head holder, which is designed to hold a test head including conventional contact points or pins (not shown) in circular or other shaped aperture 40 and a semiconductor test fixture (not shown) centrally thereof in area 41, includes two pairs of spaced vacuum cups 22a and 22b on opposite top side portions of test head plate 21. The vacuum cups are thus essentially inboard of the four corners of test head plate 21 as best seen in FIG. 5.

Figure 11:
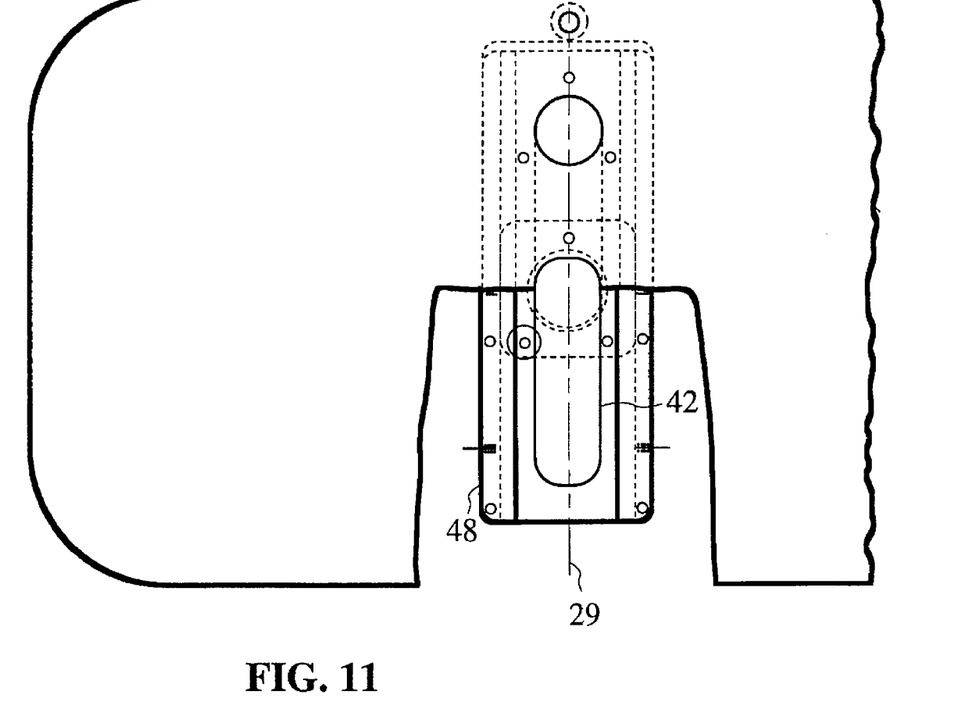
FIG. 11 is a cut-away bottom view of the handler plate showing a receiver location adjustment mechanism.
Figure 12:
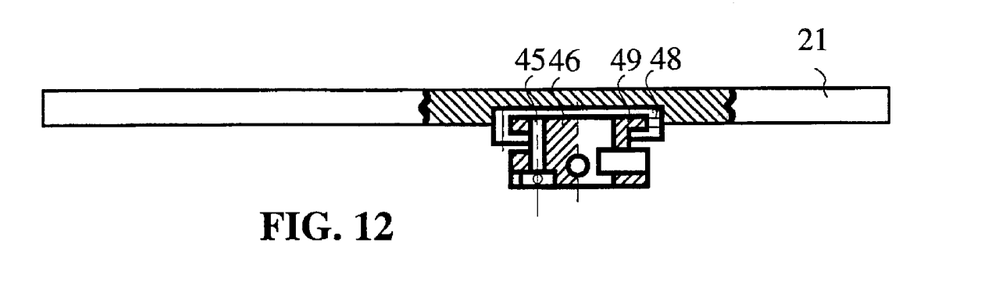
FIG. 12 is a side cross-sectional view thereof.

Between each pair of vacuum cups 22a and 22b (FIG. 1A) are a spaced pair of guiding and locking pins or mechanisms 30a and 30b, respectively, extending along common longitudinal axes 29 (see FIG. 5) of plate 21. The locking mechanisms may be positioned at various spaced positions by mounting the pairs of mechanisms in any one pair of spaced pairs of apertures 24 (FIG. 5) or by moving the mechanisms along slots 42 to a desired spaced position (FIG. 11). As seen in FIG. 12 a detent pin 46 is threaded into a location adjustment plate 49 which is movable with respect to upper docking plate 48. The end of pin 46 is threaded inwardly to abut an underside detent 45 in plate 21.

Figure 2:
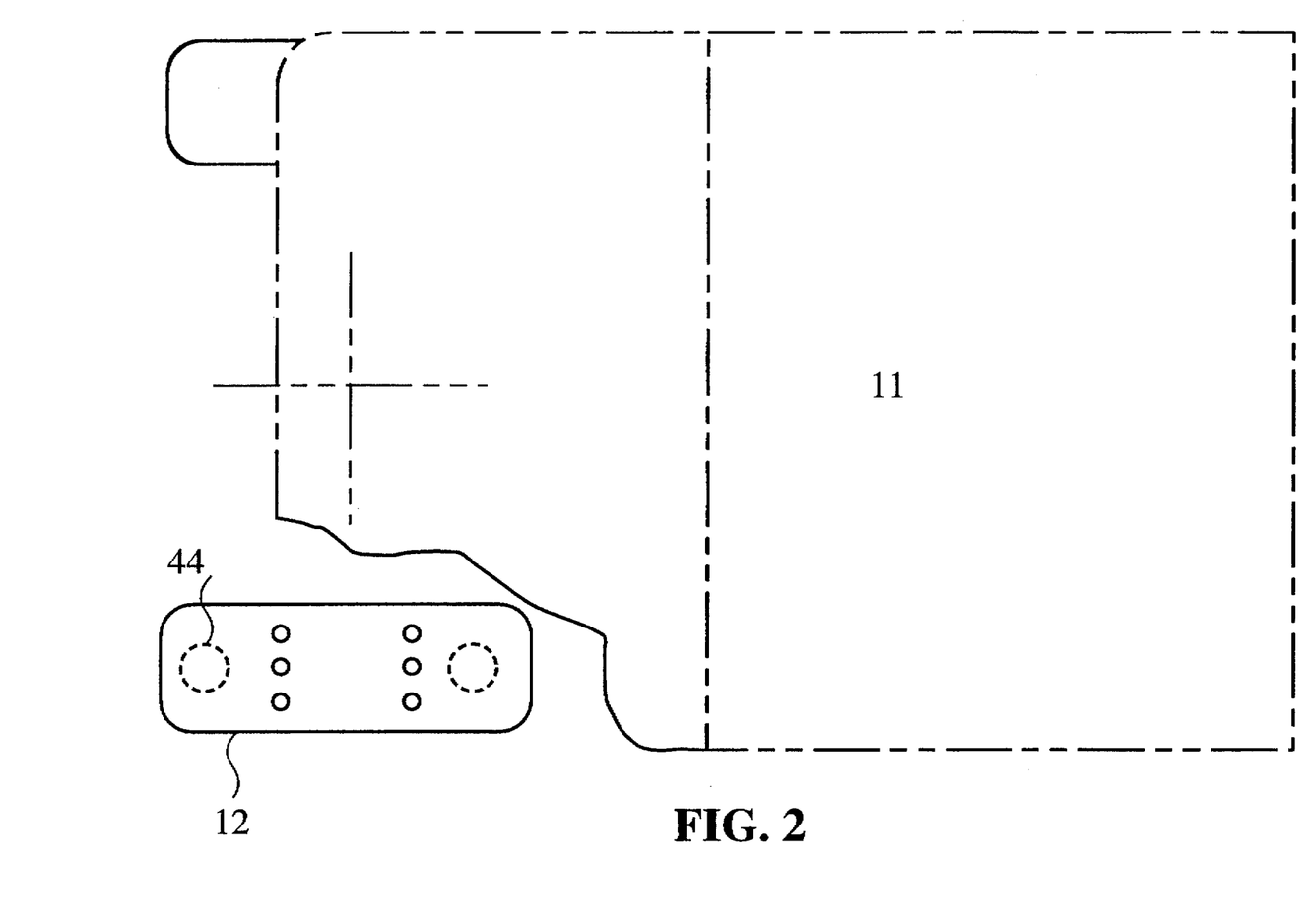
FIG. 2 is a schematic cut-away top view of the handler plate.
Figure 3:
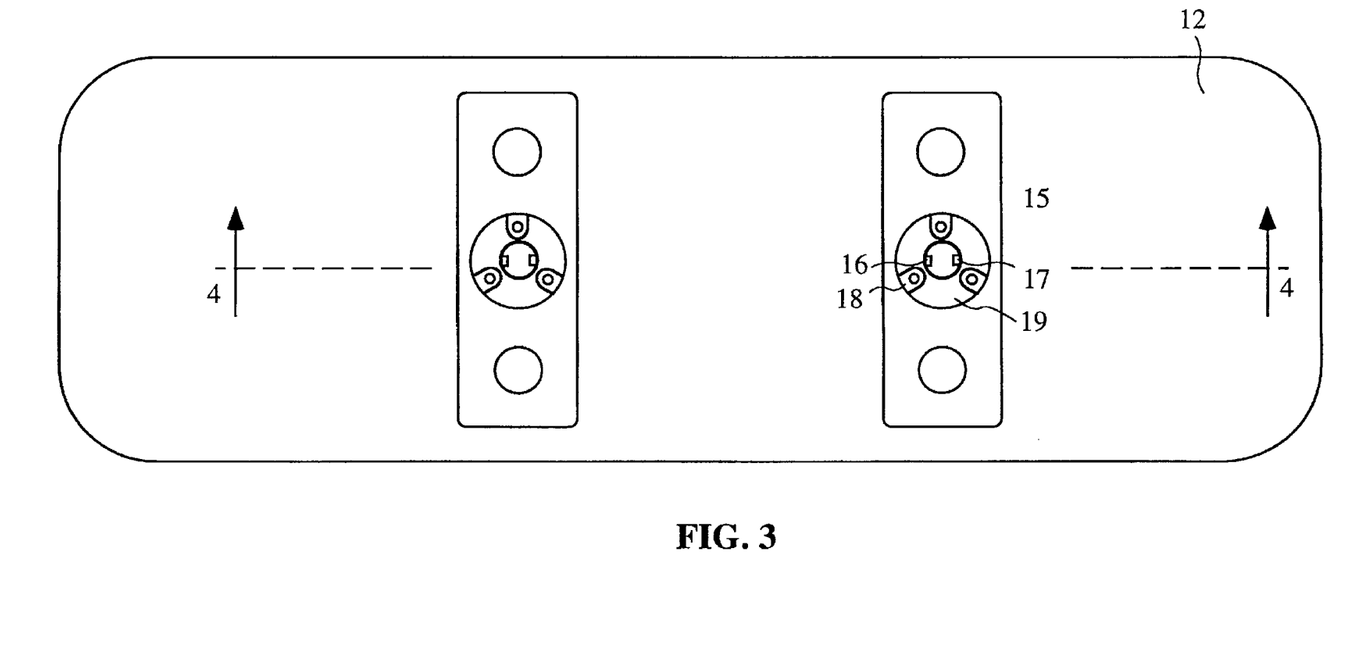
FIG. 3 is a schematic bottom view of the handler plate which face the test head.
Figure 4:
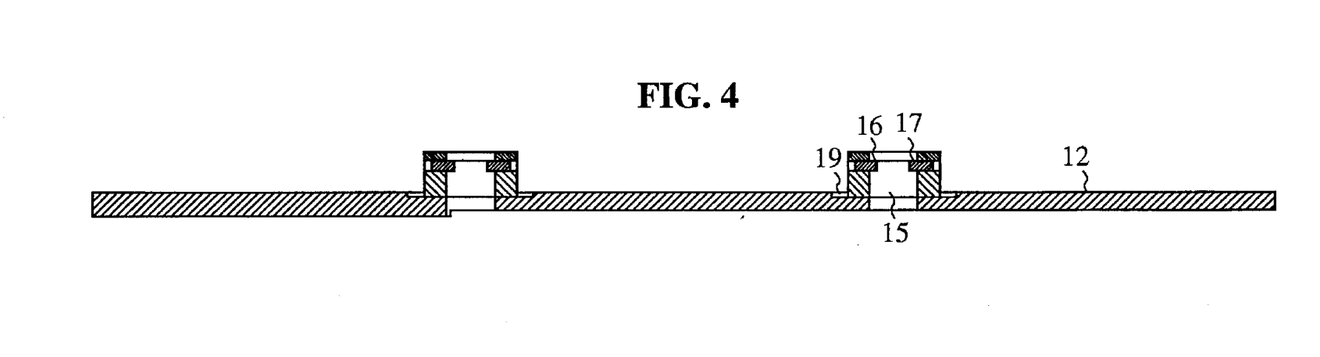
FIG. 4 is a cross-sectional view taken on line 4—4 of FIG. 3.

Each of the locking mechanisms, generally designated by the number 30, has an elongated pin 31 (FIGS. 6 and 7) including a bevelled distal end portion 32 extending upwardly from aperture 24 (shown in FIG. 5) in plate 21. The pin distal end portions 32, in interfacing with the handler 11, enter into receiving sockets 15 (FIG. 3) or slots 42 (see FIG. 11) mounted in bevelled-entrance apertures in handler plate 12. A rotary actuator 25 (FIG. 1A, FIG. 7, or FIG. 9) is connected to each elongated pin for rotating the elongated pin into locking relationship with a corresponding receiving socket 15 (FIG. 3 or FIG. 4). The vacuum cups, denoted generally by numeral 22 (FIG. 7 or FIG. 8), are vacuum engaged with typically flat end portions 44 (FIG. 2), or preferably directly on the handler plate 12 at 14 in FIG. 1A. A supporting plate 23 (FIGS. 7 and 10) functions to support the vacuum cups, more particularly the vacuum inlet 72 and supporting structure 73 of the cups (FIG. 10). Convenient and simple controls over vacuum clamping and locking operations are provided by toggle switches 27 and 28, best seen in FIG. 7 and marked LOCK-ON-OFF and VACUUM-ON-OFF, respectively, mounted to a flange 26 extending from plate 21. Activation of the toggles cause ON-OFF of the vacuum supply and ON-OFF control of the rotary actuator for the locking mechanisms.

FIG. 3 illustrates one pair of the two pairs of receiving sockets 15 of locking mechanisms 30. As seen in FIGS. 3 and 4 each of the receiving sockets 15 includes a pair of opposed fixed locking pins 16 and 17 and a flange 19 with apertures 18 for mounting the receiving sockets to plate 12 by suitable fasteners.

Figure 5A:
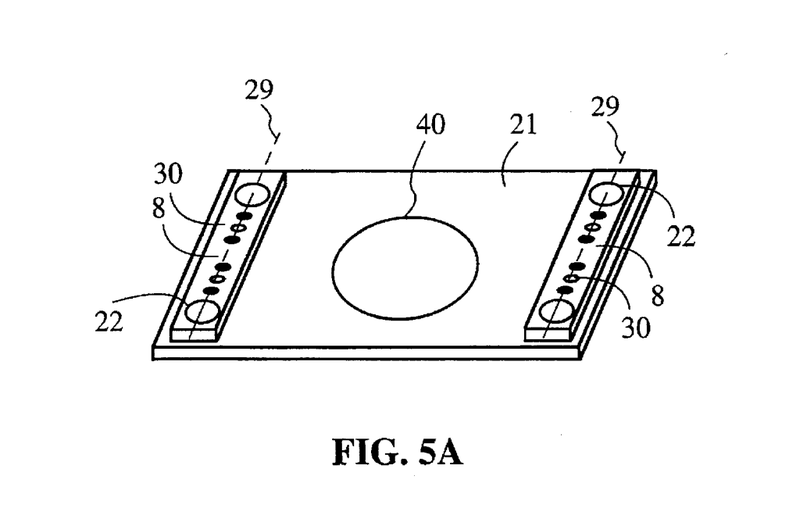
FIG. 5A is an underside perspective view of a second embodiment of the test head plate where the guiding and locking pins and vacuum cups are mounted on elongated plates attached to opposite sides of the test head plate.

FIG. 5 is a view of the semiconductor device test head plate 21. Instead of the vacuum cups 22 and locking pin mechanisms 30 being mounted directly on plate 21, two separate elongated plates 48 (FIGS. 11 and 12) having elongated slots 42 along a centerline thereof permit movement of the receiving sockets 15 longitudinally to adjust the spacing between each pair of receiving sockets 15 to correspond with the spacing between each pair of elongated pins 31 of the locking mechanisms 30 contained on the test head plate 21. The spacing adjustment of the locking mechanisms and receiving sockets permit their movement in slots 42 outwardly or inwardly from the mid-point along the slot longitudinal axis 29 to allow room for larger or more than one docking plate in area 41 (see FIG. 1B) for mounting semiconductor devices under test. Detents 45 and detent pins 46 may be included adjacent to the sockets, elongated pin support structure, and the slots, respectively to index the pairs of mechanisms to corresponding spacings. Knurled thumb screws (not shown) may be used to lock the receiving sockets 15 (and the elongated pin assemblies) in a desired spaced position of each pair of sockets and assemblies. In the FIG. 5A embodiment, a pair of elongated plates 8 mount the glide and lock mechanisms 30 and the vacuum cups. Such an arrangement is particularly useful for retrofitting existing test head plates.

As seen in FIGS. 3 and 4 each of the receiving sockets 15 includes a pair of opposed fixed locking pins 16 and 17 and a flange 19 with apertures 18 for mounting the receiving sockets to plate 12 by suitable fasteners or to elongated plate 48 (FIGS. 11 and 12).

Figure 6:
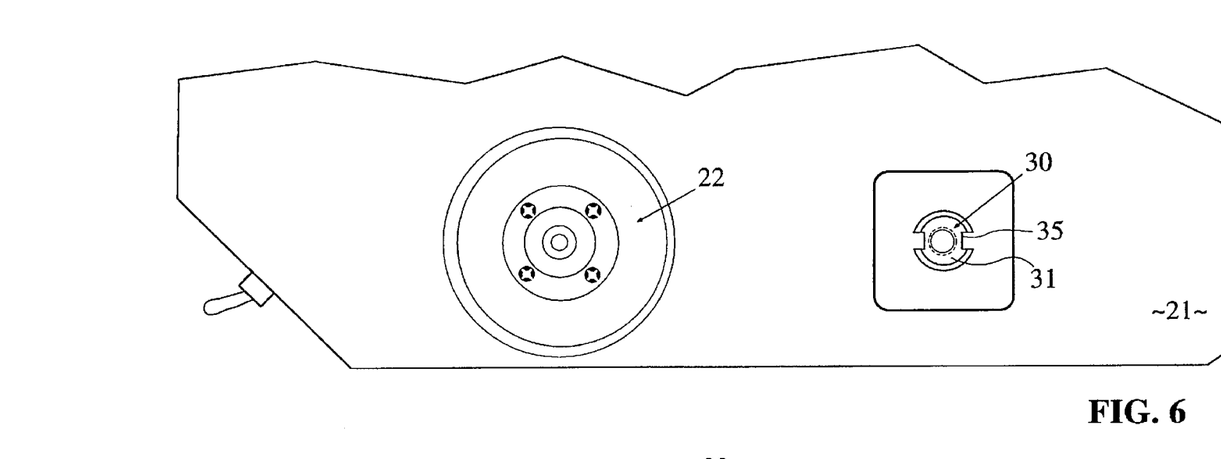
FIG. 6 is an enlarged schematic top view of the circled corner of the test head plate of FIG. 5 and locking pin in unlocked position.
Figure 7:
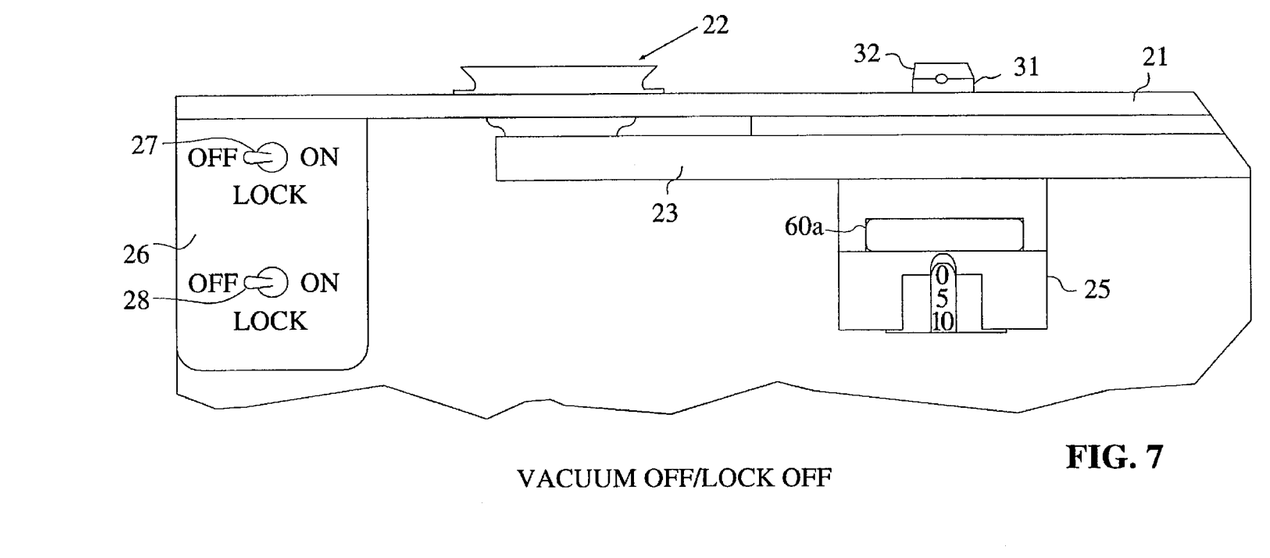
FIG. 7 is an enlarged side view thereof.

The pre-insertion mode is illustrated in FIGS. 6 and 7 where slots 35 are aligned with pins 16, 17 (FIG. 4). When the slots are inserted beyond the pins 16, 17 and are rotated 90°, so that 180° opposed portions 34a (FIG. 10) of the underside of cylindrical portion 34 abut the top of the locking pins 16, 17, removal of the elongated pin 31 from its receiving socket 15 is prevented. This eliminates transfer of vibration from a device-under-test board (not shown) and the receiving sockets fixed in the handler plate.

Figure 8:
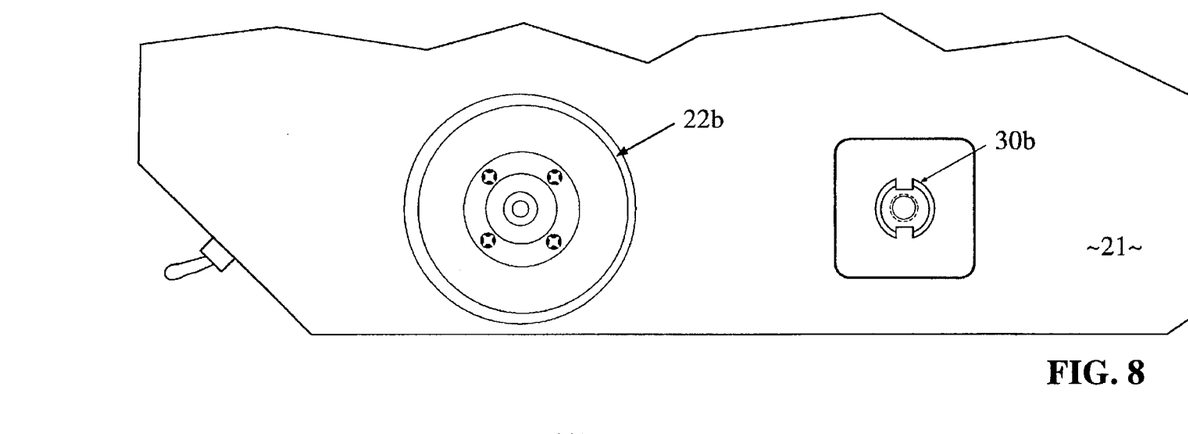
FIG. 8 is a schematic partial top view showing the guide and locking pin in locked position.
Figure 9:
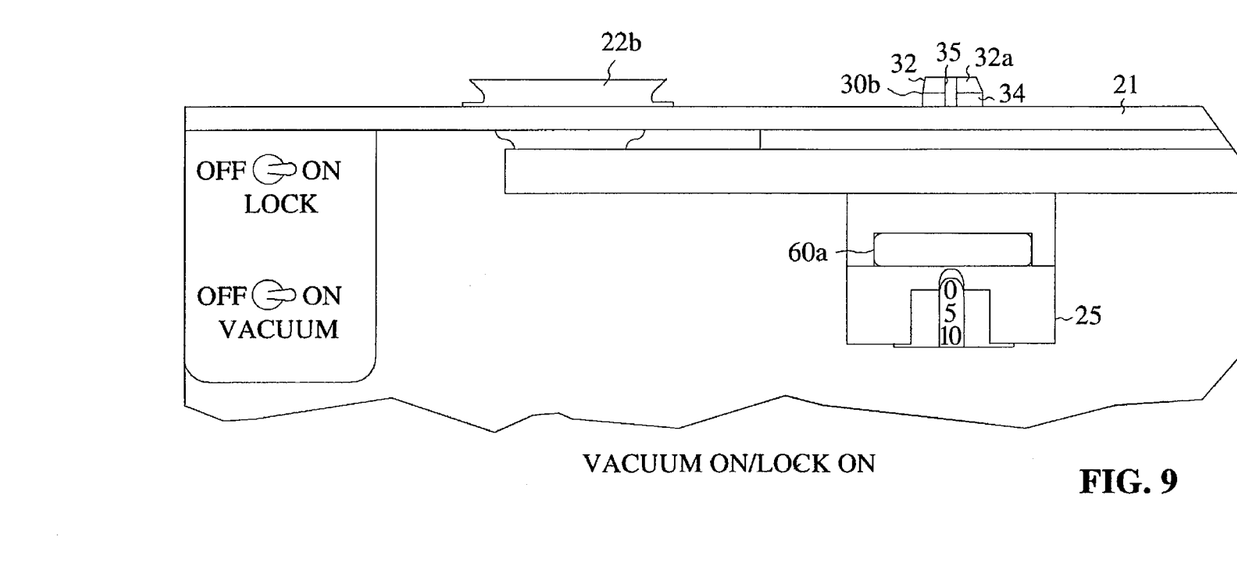
FIG. 9 is a side view thereof.
Figure 10:
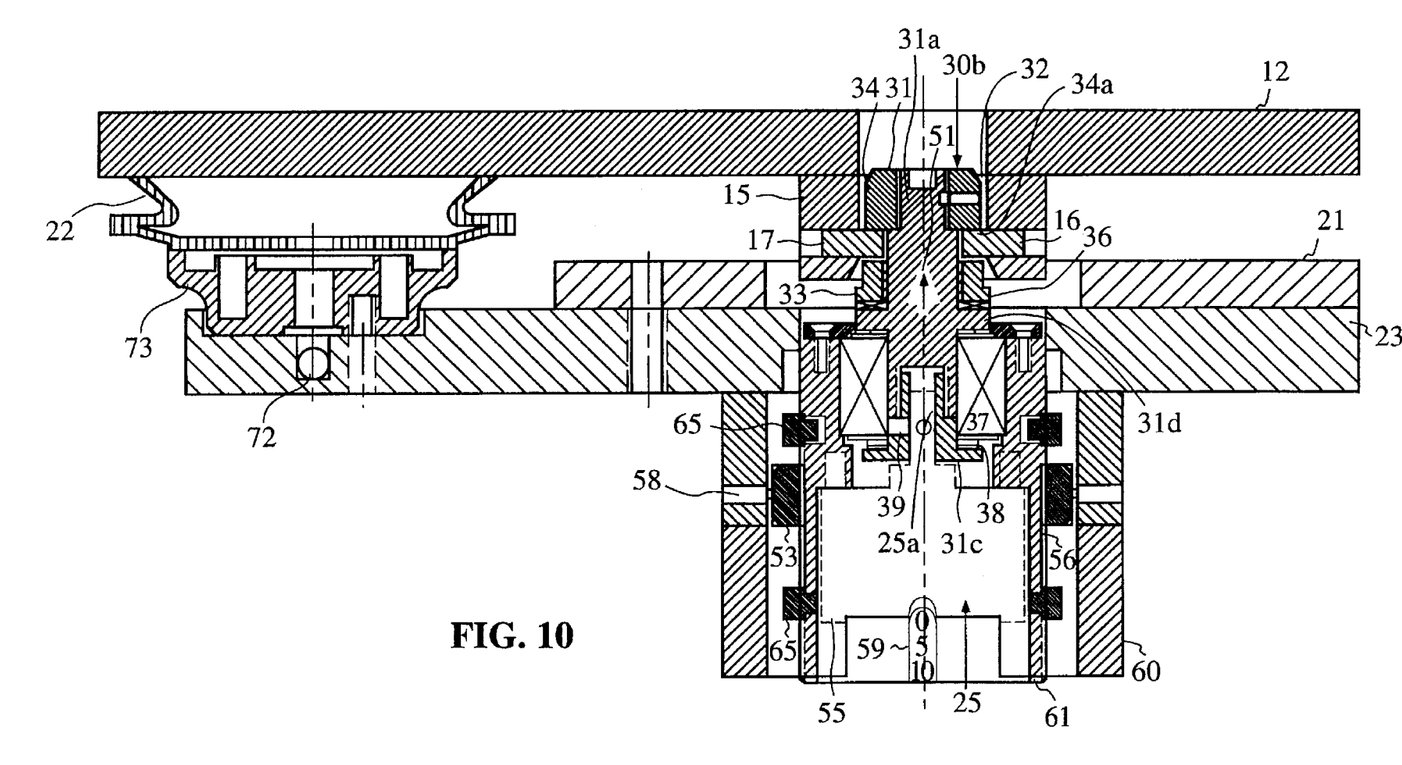
FIG. 10 is a cross-sectional side view of a vacuum cup and a locking mechanism after actuation of a rotary actuator to rotate the guide and locking pin 90° with respect to the fixed socket pins, taken on the line 10—10 of FIG. 5.

FIGS. 8 and 9 illustrate the "locked" position of plate 21 which mounts and spaces the vacuum cup 22b and the locking mechanisms 30b on a top surface thereof. The cylindrical end portion 34 of the elongated pin 31 from which the bevelled distal end 32 (truncated at 32a) extends, contains a pair of longitudinal peripheral slots 35 slightly greater in width, for example about 1 mm greater, than the width of locking pins 16, 17 (FIGS. 3 and 4) in the receiving socket. This allows the elongated pin to be inserted past the pins 16, 17, such that upon a rotation of the elongated pins 31 of about 90° by actuators 25, the elongated pins are locked into receiving sockets 15.

FIG. 10 is a detailed cross-sectional view of the guide and locking pin 31 and the vacuum cup subsection. The elongated guide and locking pin includes the bevelled frustum-conical distal end 32, the cylindrical portion 34 including 180° spaced slots 35 (FIG. 6), a shaft extension 31a, a bearing support flange 31d, a loose ring bearing sleeve 33 and a thrust bearing 36 taking the locking thrust loading against a facing surface of flange 31d. A tapered roller bearing 37 is positioned between the underside of flange 31d and the top side 38 of a shaft flange 31c. A drive shaft 31a is rotatable by actuation of actuator 25 (FIGS. 1, 5 and 10). Set screw 39 locks shaft 31a into an actuator shaft 25a. Arrow 51 illustrates that the overall locking mechanism (and its mounting structure) is movable relative to the receiving sockets 15. Thrust bearing 36 may be a Torrington FNT 1528 bearing. The roller bearing may be a Timken A4138D with a Timken A4059 tapered bearing cup.

FIG. 10 shows the rotary actuator 25 which also incorporates a Z-axis adjustment mechanism to compensate for variations in the heights and positions of the various test head boards and device-under-test cards (not shown). The actuator may be a Model NC/RB/W20—90 (20 mm bore—90°—2-way-rotary) actuator from SMC of San Jose, Calif. A Z-axis external housing 60 houses a motor 55 which provides torque for a 90° rotation of the elongated pin and a Z-axis adjustment feature. A pin Z-guide housing 61 includes a threaded surface 56 which is threaded on complementary threads on the interior surface of a dial sleeve 53. The dial sleeve is exposed in a slot 60a (FIG. 7) in the housing 60 such that an operator can access and manually rotate the dial sleeve. Rotation of circular dial sleeve 53 allows the operator to "dial-in" the stack height to control the vertical height of the elongated pin assembly relative to plate 21. Spring-loaded detent pins 58 such as Vlier ball plungers are provided in housing 60 which plungers interfit into detent apertures on the outer periphery of dial sleeve 53 to index the dial sleeve to 45° or 0.006" positions. A speed controller (not shown) is attached to the rotary actuators to control the speed of the locking mechanisms. A wavy spring washer 38 functions to preload the bearings. Rotation-indicating indicia 59 are provided on housing 61 to visually indicate Z-axis movement. Each 0–5 increment is about 6.3 mm (0.25").

Rotation of the dial adjustment Z-axis collar 53, accessed by the slot 60a in Z-axis housing 60 (FIG. 7), over 360° results in a 0.05" (1.3 mm) rising or lowering of the elongated pin assembly 30. Typically an 11/16" (1.25 cm) or up to 20 mm Z-axis adjustment range is provided. The Z-adjustment also prevents bending and stress of the test boards and damage to test probe pins and the IC devices. A series of limit stops 65 extend from Z-guide housing 61 to limit the in and out movement of the threaded housing 61 with respect to dial sleeve 53.

Once the handler plate, which normally moves down onto the test head plate, is initially docked, the closely-fitting receiving sockets and the elongated guide and locking pins will accurately position the test head and the handler for actual testing of semiconductor wafers in a test head. Typically a plurality of compressible conductive pins are positioned in pin openings in the test head.

Plate 23 also includes inlet ports 72 for connection to a vacuum pump (not shown) which evenly pulls a vacuum within the interior of vacuum cups 22 and supports 73 for supporting the vacuum cups in the plate 23. The vacuum cups typically are Part No. B75-⅛ vacuum cups supplied by PIAM of Hingham, Mass.

The above description of embodiments of this invention is intended to be illustrative and not limiting. Other embodiments of this invention will be obvious to those skilled in the art in view of the above disclosure.

I claim:

1. A semiconductor device test head docking interface system comprising:

a tester plate juxtaposed to a test head, said tester plate having at least one pair of outwardly facing spaced vacuum cups and at least one pair of spaced guiding and locking pins spaced from said cups;

a handler plate juxtaposed to a handler, said handler plate having at least one pair of vacuum surfaces shaped to receive said vacuum cups upon a docking of said plates and at least one pair of receiving sockets spaced to receive said guiding and locking pins upon a docking of said plates; and a rotatable actuator mounted on said tester plate for rotating each of said guiding and locking pins in a respective one of said receiving sockets, such that upon engagement and a pulling of vacuum in said vacuum cups against said vacuum surfaces and rotation of said guiding and locking pins, docking of said plates is effected.

2. The docking interface system of claim 1 wherein said docking and said rotation places a pre-load on the handler plate and the tester plate.

3. The docking interface system of claim 1 wherein each of said plates is an elongated plate, said vacuum cups and said vacuum surfaces being positioned respectively at locations equally spaced from ends of said plates.

4. The docking interface system of claim 3 wherein said guiding and locking pins and said receiving sockets are equally spaced from a central portion of said elongated plates.

5. The docking interface system of claim 1 wherein said tester plate includes an aperture for mounting a test head.

6. The docking interface system of claim 1 wherein said tester plate includes pairs of spaced apertures for mounting said pairs of guiding and locking pins at various lateral positions with respect to said pairs of vacuum cups.

7. The docking interface system of claim 1 further including means associated with each of said guiding and locking pins for moving said pins in a Z-axis direction toward a respective one of said receiving sockets.

8. The docking interface system of claim 7 in which said means comprises a threaded dial sleeve and a threaded housing.

9. The docking interface system of claim 8 in which said threaded housing further houses said rotatable actuator.

10. The docking interface system of claim 1 wherein said receiving sockets include a pair of facing opposed handler locking pins and wherein said tester guiding and locking pins include a distal end and an integral cylindrical portion including peripheral slots for entry into respective receiving sockets such that the slots are adapted to pass past the handler locking pins and the tester guiding and locking pins are rotatable by said actuator to lock behind said handler locking pins.

11. The docking interface system of claim 10 including a thrust roller bearing under said cylindrical portion and a tapered roller bearing surrounding the tester guiding and locking pins for supporting the rotation and locking of said tester guiding and locking pins in said receiving sockets.

* * * * *